United States Patent [19]

Haraguchi

[11] Patent Number: 5,469,391
[45] Date of Patent: Nov. 21, 1995

[54] SEMICONDUCTOR MEMORY DEVICE INCLUDING REDUNDANCY CIRCUIT FOR REMEDYING DEFECT IN MEMORY PORTION

[75] Inventor: Yoshiyuki Haraguchi, Hyogo, Japan

[73] Assignee: Mitsubishi Denki Kabushiki Kaisha, Tokyo, Japan

[21] Appl. No.: 305,523

[22] Filed: Sep. 13, 1994

[30] Foreign Application Priority Data

Oct. 7, 1993 [JP] Japan .................... 5-251661

[51] Int. Cl.⁶ .................... G11C 13/00
[52] U.S. Cl. .................... 365/200; 365/189.01
[58] Field of Search .................... 365/200, 189.01, 365/230.01, 203

[56] References Cited

U.S. PATENT DOCUMENTS 4,908,798  3/1990  Urai .................... 365/200

Primary Examiner—Terrell W. Fears
Attorney, Agent, or Firm—Lowe, Price, LeBlanc & Becker

[57] ABSTRACT

One transmission gate and one fuse are provided in series corresponding to a predecode signal. A fuse for turning on or off the transmission gate and a fuse for grounding an output are provided. When a redundancy memory cell row is not used, all the fuses are connected. The transmission gate is turned off, and the output is grounded. When the redundancy memory cell row is used, all the fuses excluding one fuse corresponding to the predecode signal to be transmitted are disconnected.

11 Claims, 15 Drawing Sheets

SEMICONDUCTOR MEMORY DEVICE INCLUDING REDUNDANCY CIRCUIT FOR REMEDYING DEFECT IN MEMORY PORTION

BACKGROUND OF THE INVENTION

1. Field of the Invention

The present invention generally relates to semiconductor memory devices, and more particularly, to a semiconductor memory device including a redundancy circuit for remedying a defect in a memory portion.

2. Description of the Background Art

A semiconductor memory device such as a static random access memory (hereinafter referred to as an "SRAM") and a dynamic random access memory (hereinafter referred to as a "DRAM") conventionally includes a redundancy circuit for improving yield in production. When a defect exists in a memory portion in a manufactured semiconductor memory device, the memory portion is remedied by a function of the redundancy circuit. More specifically, in a conventional semiconductor memory device, a row or column including a defective memory cell is replaced with a predetermined spare row or column.

Although the present invention can be generally applied to a semiconductor memory device such as an SRAM and a DRAM, description is given hereinafter of the case where the present invention is applied to an SRAM.

FIG. 7 is a block diagram showing a configuration of a conventional SRAM 500. Referring to FIG. 7, SRAM 500 includes n memory cell blocks $BK_0$ to $BK_{n-1}$, and a block selector circuit 32 for selecting memory cell blocks $BK_0$ to $BK_{n-1}$ to be accessed. One of memory cell blocks $BK_0$ to $BK_{n-1}$, for example, memory cell block $BK_0$, includes a memory cell array 1a, a redundancy memory cell row (RMC) 7a, a row decoder 3a, a redundancy row decoder (RRD) 550a, a bit line load circuit 17a connected to a bit line, a multiplexer 8a for selecting a bit line pair to be accessed, a write buffer 33a for writing data, and a sense amplifier 9a for reading data.

SRAM 500 further includes a row address buffer 2 receiving an externally applied row address signal RA, a column address buffer 5 receiving an externally applied column address signal CA, a block address buffer 31 receiving an externally applied block address signal BA, a row predecoder 4 predecoding a column address signal X provided from row address buffer 2, a column decoder 6 decoding a column address signal Y provided from column address buffer 5, a data input buffer 13 receiving input data Di, a data output buffer 10 providing output data Do, and a read/write control circuit 16 operating in response to an externally applied chip select signal CS and a read/write control signal RWC.

Block selector circuit 32 provides block select signals $BS_0$ to $BS_{n-1}$ for selecting memory cell blocks $BK_0$ to $BK_{n-1}$ in response to a signal Z provided from block address buffer 31. Each of block select signals $BS_0$ to $BS_{n-1}$ is applied to a corresponding row decoder and a corresponding sense amplifier in a corresponding one of memory cell blocks $BK_0$ to $BK_{n-1}$. The corresponding row decoder and the corresponding sense amplifier operate in response to the activated block select signal.

Normal access operation will now be described. When memory cell block $BK_0$ is accessed, for example, the activated block select signal $BS_0$ is applied to row decoder 3a and sense amplifier 9a. In data reading operation, row decoder 3a and column decoder 6 designate a memory cell, not shown, in memory cell array 1a. A data signal stored in the designated memory cell is applied to sense amplifier 9a through multiplexer 8a. The data signal amplified by sense amplifier 9a is provided as output data Do through data output buffer 10.

In writing operation, input data Di is applied to write buffer 33a through data input buffer 13. In response to a control signal provided from read/write control circuit 16, write buffer 33a applies the applied data signal to memory cell array 1a through multiplexer 8a. Therefore, data is written to the memory cell designated by row decoder 3a and column decoder 6.

When there is a defect in a certain memory cell row in memory cell array 1a, the defective memory cell row is functionally replaced with redundancy memory cell row 7a as follows. A defective memory cell address indicating a position of the defective memory cell row is programmed by selectively disconnecting a fuse (not shown) provided in redundancy row decoder 550a. Therefore, when access is required to a row including a defective memory cell, redundancy memory cell row 7a is accessed instead of the defective memory cell row because of the function of redundancy row decoder 550a. In other words, the defective memory cell row is replaced with redundancy memory cell row 7a. Operation of these redundancy circuits for remedy of a defective memory cell will be described later in detail.

FIG. 8 is a circuit diagram of a main portion including memory cell array 1a of SRAM 500 shown in FIG. 7. Referring to FIG. 8, for simplification of illustration, only four memory cells 24a to 24d in memory cell array 1 are shown. Memory cells 24a and 24c are connected between bit lines 20a and 20b. Memory cells 24b and 24d are connected between bit lines 21a and 21b.

Bit line load circuit 17a includes n channel MOS transistors 25a, 25b, 26a and 26b each connected between a corresponding one of bit lines 20a, 20b, 21a and 21b and the power supply potential $V_{CC}$. On the other hand, multiplexer 8a includes n channel MOS transistors 27a, 27b, 28a and 28b connected between an I/O line pair 29a, 29b and bit lines 20a, 20b, 21a and 21b. I/O line pair 29a and 29b is connected to the input of sense amplifier 9a and the output of write buffer 33a.

Row decoder 3a selectively activates one of the word lines $WL_0$ and $WL_1$ connected to memory cells 24a, 24b, 24c, 24d to accessed. Memory cells 24a and 24b connected to the word line $WL_0$ configure one memory cell row. When the word line $WL_0$ is activated, for example, a memory cell row including memory cells 24a and 24b is accessed. On the other hand, column decoder 6 activates one of column select signals $Y_0$ and $Y_1$ for selecting a memory cell column to be accessed. When the column select signal $Y_0$ is activated, for example, transistors 27a and 27b are turned on. Therefore, a memory cell column including memory cells 24a and 24c is accessed.

FIG. 9 is a circuit diagram showing one example of the memory cell shown in FIG. 8. Referring to FIG. 9, memory cell MC1 (for example, 24a of FIG. 8) includes N channel MOS transistors 41a and 41b, resistances 43a and 43b serving as high resistance loads, and N channel MOS transistors 42a and 42b serving as access gates.

FIG. 10 is a circuit diagram showing another example of the memory cell shown in FIG. 8. Referring to FIG. 10, memory cell MC2 includes N channel MOS transistors 41a and 41b, P channel MOS transistors 44a and 44b serving as loads, and N channel MOS transistors 42a and 42b serving as access gates.

FIG. 11 is a timing chart for explaining reading operation of memory cell 24a shown in FIG. 8. Referring to FIG. 11, the abscissa represents the lapse of time, and the ordinate represents the potential (volt). The line ADi represents change of input signals of row address buffer 2 and column address buffer 5. The line ADo represents change of output signals of row address buffer 2 and column address buffer 5. The line $WL_0$ represents change of the word line $WL_0$ connected to memory cell 24a. The line I/O represents change of I/O line pair 29a and 29b. The line $SA_0$ represents change of an output signal of sense amplifier 9a. The line Do represents change of an output signal of data output buffer 10.

At time $t_0$, an input address signal ADi changes. Therefore, the output signals ADo of address buffers 2 and 5 change at time $t_1$. Since the potential of the word line $WL_0$ changes at time $t_2$, a data signal stored in memory cell 24a is transmitted to bit line pair 20a, 20b. In addition, since the column select signal $Y_0$ provided from column decoder 6 attains a high level, transistors 27a and 27b are turned on. Therefore, at time $t_3$, the potential of I/O line pair 29a and 29b changes.

At time $t_4$, since sense amplifier 9a is activated in response to a control signal provided from read/write control circuit 16, data is amplified by sense amplifier 9a. Therefore, at time $t_5$, the output signal Do of data output buffer 10 changes according to data read out from memory cell 24a.

FIG. 12 is a circuit diagram of row predecoder 4 shown in FIG. 7. FIG. 12 shows the case where only two bits of the row address signal RA are predecoded. Referring to FIG. 12, predecoder 4 includes NAND gates 45a to 45d selectively receiving signals X1 and X2 provided from row address buffer 2 shown in FIG. 7 and inverted signals $\overline{X1}$ and $\overline{X2}$ thereof, respectively, and inverters 46a to 46d. Outputs of inverters 46a to 46 serve as predecode signals respectively corresponding to $\overline{X1}\cdot\overline{X2}$, $X1\cdot\overline{X2}$, $\overline{X1}\cdot X2$, and $X1\cdot X2$.

Operation of predecoder 4 will now be described. The row address signal RA corresponding to an address selected when X1 and X2 are at a low level is externally applied to row address buffer 2 shown in FIG. 7. Row address buffer 2 provides the signals X1 and X2 at a low level and the signals $\overline{X1}$ and $\overline{X2}$ at a high level. Therefore, only NAND gate 45a shown in FIG. 12 provides a signal at a low level, and the other NAND gates 45b to 45d provide signals at a high level. As a result, only the predecode signal $\overline{X1}\cdot\overline{X2}$ attains a high level (activated), and the other predecode signals $X1\cdot\overline{X2}$, $\overline{X1}\cdot X2$, and $X1\cdot X2$ are maintained at a low level.

Similarly, when the row address signal RA corresponding to an address selected when X1 is at a high level and X2 is at a low level is applied, only $X1\cdot\overline{X2}$ attains a high level (activated), and the other predecode signals are maintained at a low level. When the row address signal RA corresponding to an address selected when X1 is at a low level and X2 is at a high level is applied, only $\overline{X1}\cdot X2$ attains a high level (activated), and the other predecode signals are maintained at a low level. When the row address signal RA corresponding to an address selected when X1 and X2 are at a high level, only $X1\cdot X2$ attains a high level (activated), and the other predecode signals are maintained at a low level.

FIG. 13 is a circuit diagram of block selector circuit 32 shown in FIG. 7. Referring to FIG. 13, block selector circuit 32 includes NAND gates 100a to 100d selectively receiving two of signals Z0 and Z1 provided from block address buffer 31 and inverted signals $\overline{Z0}$ and $\overline{Z1}$ thereof, respectively, and inverters 101a to 101d. Although SRAM 500 shown in FIG. 7 includes n memory blocks, block selector circuit 32 shown in FIG. 13 is shown as a circuit for selecting one of four memory blocks, for simplification of illustration and description. The input signals Z0, $\overline{Z0}$, Z1 and $\overline{Z1}$ are obtained based on data of the lower two bits of an externally applied block address signal BA. Inverters 101a to 101d respectively provide block select signals $BS_0$ to $BS_3$.

Description will now be given of operation of block selector circuit 32. The case is described as one example where the memory cell block $BK_0$ is selected. The block address signal BA externally designating the memory block $BK_0$ is applied to block address buffer 31 shown in FIG. 7. Block address buffer 31 provides the signals Z0 and Z1 at a low level and the signals $\overline{Z0}$ and $\overline{Z1}$ at a high level. Therefore, only NAND gate 100a shown in FIG. 13 provides a signal at a low level, and the other NAND gates 100b to 100d provides signals at a high level, respectively. As a result, only the block select signal $BS_0$ attains a high level (activated), and the other block select signals $BS_1$ to $BS_3$ are maintained at a low level.

FIG. 14 is a circuit block diagram of row decoder 3a and redundancy row decoder 550a shown in FIG. 7. FIG. 14 shows only the circuit portion for accessing eight memory cell rows and one redundancy memory cell row in memory cell array 1a. It is pointed out row decoder 3b, . . . and redundancy row decoder 550b, . . . provided in the other memory cell blocks $BK_1$ to $BK_{n-1}$ shown in FIG. 7 have the same circuit configuration as shown in FIG. 14.

Referring to FIG. 14, row decoder 3a includes NAND gates 55a to 55h selectively receiving signals X0, $\overline{X0}$, $\overline{X1}\cdot\overline{X2}$, $X1\cdot\overline{X2}$, $\overline{X1}\cdot X2$, and $X1\cdot X2$ provided from predecoder 4 shown in FIG. 7, respectively, and inverters 56a and 56h. Outputs of inverters 56a to 56h are respectively connected to the word lines $WL_0$ to $WL_7$. The predecode signals X0, $\overline{X0}$, $\overline{X1}\cdot\overline{X2}$, $X1\cdot\overline{X2}$, $\overline{X1}\cdot X2$, and $X1\cdot X2$ are obtained from the lower three bits of the externally applied row address signal RA.

Redundancy row decoder 550a includes a redundancy enable circuit 51 for enabling redundancy row decoder 550a per se, address program circuits 52 and 53 for programming a defective address defining a memory cell row including a defective memory cell, an NAND gate 55i, and an inverter 56i. The output of inverter 56i is connected to a word line WLR for accessing redundancy memory cell row 7. NAND gate 55i is connected to receive redundancy enable signals RE, Sa and Sb provided from redundancy enable circuit 51, address program circuits 52 and 53.

FIG. 15 is a circuit diagram of redundancy enable circuit 51. Redundancy enable circuit 51 shown in FIG. 14 is implemented with circuit 51 shown in FIG. 15. Referring to FIG. 15, redundancy enable circuit 51 includes a capacitor 71, a resistance 72, and a P channel MOS transistor 74 connected in parallel between the power supply potential $V_{CC}$ and a node 70, a fuse 73 for programming connected between node 70 and the ground, and cascaded inverters 75 and 76.

When a redundancy circuit is used, that is, when a defective memory cell exists in a memory cell array, fuse 73 is disconnected. Therefore, since node 70 is maintained at a high level, that is, at the power supply potential $V_{CC}$, the redundancy enable signal RE at a high level is provided. On the other hand, when a redundancy circuit is not used, that is, when there is no defective memory cell in a memory cell array, fuse 73 is not disconnected. Therefore, since node 70 is maintained at a low level, that is, at the ground level, the redundancy enable signal RE at a low level is provided.

FIG. 16 is a circuit diagram of address program circuit 52. Address program circuit 52 shown in FIG. 14 is implemented with circuit 52 shown in FIG. 16. Referring to FIG. 16, address program circuit 52 includes a capacitor 61, a resistance 62, and a P channel MOS transistor 64 connected in parallel between the power supply potential $V_{CC}$ and node 60, a fuse 63 for programming connected between node 60 and the ground, cascaded inverters 65 and 66, and two CMOS transmission gates TG1 and TG2. Transmission gate TG1 passes the input signal $\overline{X0}$ in response to the potential of a node 67. Transmission gate TG2 passes the input signal X0 in response to the potential of node 67. One of the input signals X0 and $\overline{X0}$ is provided as an output signal Sa in response to connection or disconnection of fuse 63.

In operation, when fuse 63 is disconnected, the potential of node 60 is maintained at a high level. Therefore, since the potential of node 67 is fixed to a low level by inverter 65, transmission gate TG2 is turned on. Therefore, the input signal X0 is transmitted as the output signal Sa. On the contrary, when fuse 63 is connected, the potential of node 60 is maintained at a low level. Therefore, the potential of node 67 is maintained at a high level. Since transmission gate TG1 is turned on, the input signal $\overline{X0}$ is transmitted as the output signal Sa.

FIG. 17 is a circuit diagram of address program circuit 53. Address program circuit 53 shown in FIG. 14 is implemented with circuit 53 shown in FIG. 17. Referring to FIG. 17, address program circuit 53 includes a capacitor 161, a resistance 162, and a P channel MOS transistor 164 connected in parallel between the power supply potential $V_{CC}$ and a node 160, a fuse 163 for programming connected between node 160 and the ground, and cascaded inverters 165 and 166. Address program circuit 53 further includes a capacitor 261, a resistance 262, and a P channel MOS transistor 264 connected in parallel between the power supply potential $V_{CC}$ and a node 260, a fuse 263 for programming connected between node 260 and the ground, and cascaded inverters 265 and 266.

Address program circuit 53 further includes four sets of CMOS transmission gates TG11 and TG21, TG12 and TG22, TG13 and TG23, and TG14 and TG24, in which the two transmission gates are connected in series in each set. Transmission gates TG11 and TG21 pass the input signal $\overline{X1}\cdot\overline{X2}$ in response to the potentials of nodes 167 and 267. One of the input signals X1·X2, $\overline{X1}$·X2, X1·$\overline{X2}$, and $\overline{X1}\cdot\overline{X2}$ is provided as an output signal Sb in response to connection or disconnection of fuses 163 and 263.

In operation, when fuses 163 and 263 are disconnected, the potentials of nodes 160 and 260 are maintained at a high level. Therefore, since the potentials of nodes 167 and 267 are fixed to a low level by inverters 165 and 265, transmission gates TG12, TG14, TG23, and TG24 are turned on. Only series connected transmission gates TG14 and TG24 pass the input signal X1·X2. Therefore, the input signal X1·X2 is transmitted as the output signal Sb.

When fuse 163 is connected and fuse 263 is disconnected, the potentials of nodes 160 and 260 are maintained at a low level and a high level, respectively. Therefore, since the potentials of nodes 167 and 267 are fixed to a high level and a low level, respectively, by inverters 165 and 265, transmission gates TG11, TG13, TG23, and TG24 are turned on. Only series connected transmission gates TG13 and TG23 pass the input signal $\overline{X1}$·X2. Therefore, the input signal $\overline{X1}$·X2 is transmitted as the output signal Sb.

When fuse 163 is disconnected and fuse 263 is connected, the potentials of nodes 160 and 260 are maintained at a high level and a low level, respectively. Therefore, since the potentials of nodes 167 and 267 are fixed to a low level and a high level, respectively, by inverters 165, 265, transmission gates TG12, TG14, TG21, and TG22 are turned on. Only series connected transmission gates TG12 and TG22 pass the input signal X1·$\overline{X2}$. Therefore, the input signal X1·$\overline{X2}$ is transmitted as the output signal Sb.

When fuse 163 and fuse 263 are connected, the potentials of nodes 160 and 260 are maintained at a low level. Therefore, since the potentials of nodes 167 and 267 are fixed to a high level by inverters 165 and 265, transmission gates TG11, TG13, TG21, and TG22 are turned on. Only series connected transmission gates TG11 and TG21 pass the input signal $\overline{X1}\cdot\overline{X2}$. Therefore, the input signal $\overline{X1}\cdot\overline{X2}$ is transmitted as the output signal Sb.

Operation of redundancy row decoder 550a shown in FIG. 14 to which circuits shown in FIGS. 15, 16 and 17 are applied will be described hereinafter. The case will be first described where there is no defective memory cell in memory cell array 1a, that is, where redundancy memory cell row 7a is not accessed. In this case, a fuse (corresponding to fuse 73 shown in FIG. 15) in redundancy enable circuit 51 is not disconnected. Therefore, the redundancy enable signal RE at a low level is applied to NAND gate 55i. Therefore, since the output signal of NAND gate 55i is maintained at a high level, inverter 56i provides a redundancy word line signal WLR at a low level. As a result, redundancy memory cell row 7a is not to be accessed.

NAND gates 55a to 55h in row decoder 3a receive the output signal at a high level of NAND gate 55i and the block select signal $BS_0$ at a high level. Therefore, NAND gates 55a to 55h selectively activate one of the word lines $WL_0$ to $WL_7$ (selectively brings one word line to a high level) in response to the signals X0, $\overline{X0}$, X1·X2, X1·$\overline{X2}$, $\overline{X1}$·X2, and $\overline{X1}\cdot\overline{X2}$ provided from predecoder 4. Therefore, a memory cell row connected to the activated word line can be accessed.

When there is a defective memory cell in memory cell array 1a, that is, when a defective memory cell is replaced with redundancy memory cell row 7a, a fuse (corresponding to fuse 73 shown in FIG. 15) in redundancy enable circuit 51 is disconnected. Therefore, the redundancy enable signal RE at a high level is applied to NAND gate 55i. In addition, a row in which the defective memory cell exists, that is, a row address defining a defective memory cell, is programmed by selectively disconnecting fuses in address program circuits 52 and 53.

Provided that there is a defective memory cell in a memory cell row connected to the word line $WL_0$, a program for defining the memory cell row is carried out. More specifically, by maintaining corresponding fuses 63, 163 and 263 in connection in row address program circuits 52 and 53, programming for defining the memory cell row is carried out. As a result, address program circuit 52 provides the input signal $\overline{X0}$ as the output signal Sa. On the other hand, address program circuit 53 provides the input signal $\overline{X1}\cdot\overline{X2}$ as the output signal Sb. Therefore, when the input signals $\overline{X0}$ and $\overline{X1}\cdot\overline{X2}$ both at a high level are provided, the output signals Sa and Sb at a high level are provided to NAND gate 55i. As a result, since NAND gate 55i provides a signal at a low level, inverter 56i provides the redundancy word line signal WLR at a high level. In response to the redundancy word line signal WLR at a high level, redundancy memory cell row 7a is accessed. In addition, since the output signal at a low level of NAND gate 55i is also provided to NAND gate 55a, NAND gate 55a is disabled. In other words, the memory cell row connected to the word line $WL_0$ is not to be accessed.

As another example, when there is a defective memory cell in a memory cell row connected to the word line $WL_0$, corresponding fuse 63 in address program circuit 52 is disconnected, and corresponding fuses 163 and 263 in address program circuit 53 are maintained in connection. As a result, NAND gate 55i is enabled upon application of the input signals X0 and $\overline{X1} \cdot \overline{X2}$ at a high level, resulting in activation of the redundancy word line signal WLR.

Although programming for selecting one of eight memory cell rows is described above, a large number of memory cell rows are actually included in memory cell array 1a. Therefore, it is pointed out that address program circuits are additionally provided according to the number of memory cell rows. There is also a case where a predecode signal is formed of three bits of the row address signal RA. At this time, the number of outputs of the predecoder becomes eight.

FIG. 18 is a circuit diagram of address program circuit 54 in the case of eight predecoder outputs. Referring to FIG. 18, address program circuit 54 includes capacitor 161, resistance 162 and P channel MOS transistor 164 connected in parallel between the power supply potential $V_{CC}$ and node 160, fuse 163 for programming connected between node 160 and the ground, and cascaded inverters 165 and 166. Address program circuit 54 further includes capacitor 261, resistance 262 and P channel MOS transistor 264 connected in parallel between the power supply potential $V_{CC}$ and node 260, fuse 263 for programming connected between node 260 and the ground, and cascaded inverters 265 and 266. Address program circuit 54 further includes a capacitor 361, a resistance 362 and a P channel MOS transistor 364 connected in parallel between the power supply potential $V_{CC}$ and a node 360, a fuse 363 for programming connected between node 360 and the ground, and cascaded inverters 365 and 366.

Address program circuit 54 further includes eight sets of CMOS transmission gates TG11, TG21 and TG31, TG12, TG22 and TG32, TG13, TG23 and TG33, TG14, TG24 and TG34, TG15, TG25 and TG35, TG16, TG26 and TG36, TG17, TG27 and TG37, and TG18, TG28 and TG38, in which the three transmission gates are connected in series in each set. Transmission gates TG11, TG21, and TG31 pass an input signal $\overline{X1} \cdot \overline{X2} \cdot \overline{X3}$ in response to the potentials of nodes 167, 267 and 367. An input signal X1·X2·X3, that is, one of X1·X2·X3, X1·$\overline{X2}$·X3, $\overline{X1}$·$\overline{X2}$·X3, X1·X2·$\overline{X3}$, $\overline{X1}$·X2·$\overline{X3}$, X1·$\overline{X2}$·$\overline{X3}$ and $\overline{X1}$·$\overline{X2}$·$\overline{X3}$, is provided as the output signal Sb in response to connection or disconnection of fuses 163, 263 and 363.

In operation, when fuses 163, 263 and 363 are disconnected, the potentials of nodes 160, 260 and 360 are maintained at a high level. Therefore, the potentials of nodes 167, 267 and 367 are fixed to a low level by inverters 165, 265 and 365, transmission gates TG12, TG14, TG16, TG18, TG23, TG24, TG27, TG28, TG35, TG36, TG37 and TG38 are turned on. Only transmission gates TG18, TG28 and TG38 out of the series connected transmission gates pass the input signal X1·X2·X3. Therefore, the input signal X1·X2·X3 is transmitted as the output signal Sb.

As another example, when fuse 163 is connected and fuses 263 and 363 are disconnected, the potential of node 160 is maintained at a low level, and the potentials of nodes 260 and 360 are maintained at a high level. Since the potential of node 167 is fixed to a low level by inverter 165, and the potentials of nodes 267 and 367 are fixed to a low level by inverters 265 and 365, transmission gates TG11, TG13, TG15, TG17, TG23, TG24, TG27, TG28, TG35, TG36, TG37 and TG38 are turned on. Only transmission gates TG17, TG27 and TG37 out of the series connected transmission gates pass the input signal $\overline{X1}$·X2·X3. Therefore, the input signal $\overline{X1}$·X2·X3 is transmitted as the output signal Sb.

When fuses 163, 263 and 363 are connected, the potentials of nodes 160, 260 and 360 are maintained at a low level. Therefore, since the potentials of nodes 167, 267 and 367 are fixed to a high level by inverters 165, 265 and 365, transmission gates TG11, TG13, TG15, TG17, TG21, TG22, TG25, TG26, TG31, TG32, TG33 and TG34 are turned on. Only transmission gates TG11, TG21 and TG31 out of the series connected transmission gates pass the input signal $\overline{X1} \cdot \overline{X2} \cdot \overline{X3}$. Therefore, the input signal $\overline{X1} \cdot \overline{X2} \cdot \overline{X3}$ is transmitted as the output signal Sb.

SUMMARY OF THE INVENTION

One object of the present invention is to provide a semiconductor memory device of a high speed responsibility with low power consumption without addition of a large capacitance by a transmission gate.

Another object of the present invention is to provide a semiconductor memory device in which a large capacitance is not added only to a particular predecode signal.

The semiconductor memory device according to one aspect of the present invention includes a redundancy circuit for replacing a defective memory cell with a redundancy memory cell. The redundancy circuit includes a programming circuit for carrying out programming for replacing the defective memory cell with the redundancy memory cell. The programming circuit includes a first fuse for selecting between usage and nonusage of the redundancy memory cell, a second fuse for selecting a designation signal for designating the defective memory cell, a transmission gate provided in series with the second fuse, and a potential fixing circuit turning on or off the transmission gate in response to connection or disconnection of the first fuse.

Because of the above configuration, when there is no defective memory cell and a redundancy memory cell is not used, the transmission gate is turned off with the first fuse connected, thereby inhibiting passage of all the designation signals. When there is a defective memory cell and the redundancy memory cell is used, the transmission gate is turned on with the first fuse disconnected, and unnecessary second fuses are all disconnected with necessary second fuses connected, whereby only a designation signal for designating the defective memory cell is passed. Therefore, independently of usage or nonusage of the redundancy memory cell, a capacitance of only one transmission gate at maximum is added to the designation signal. Unlike the conventional case, a capacitance of a number of transmission gates will not added to a particular predecode signal. As a result, the designation signal will not be delayed in rising and falling times, and unnecessary power will not be consumed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
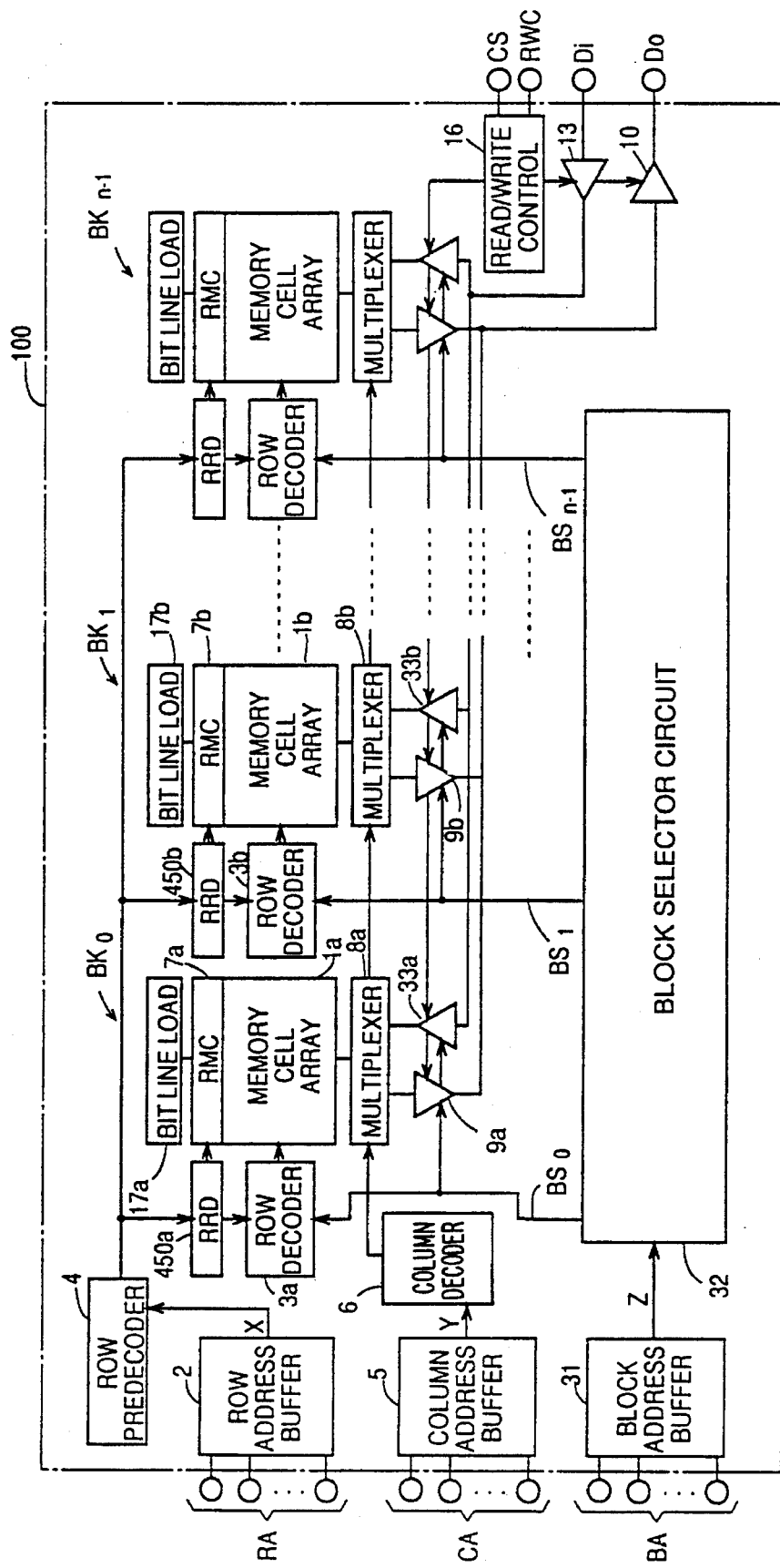
FIG. 1 is a block diagram of an SRAM according to one embodiment of the present invention.
Figure 7:
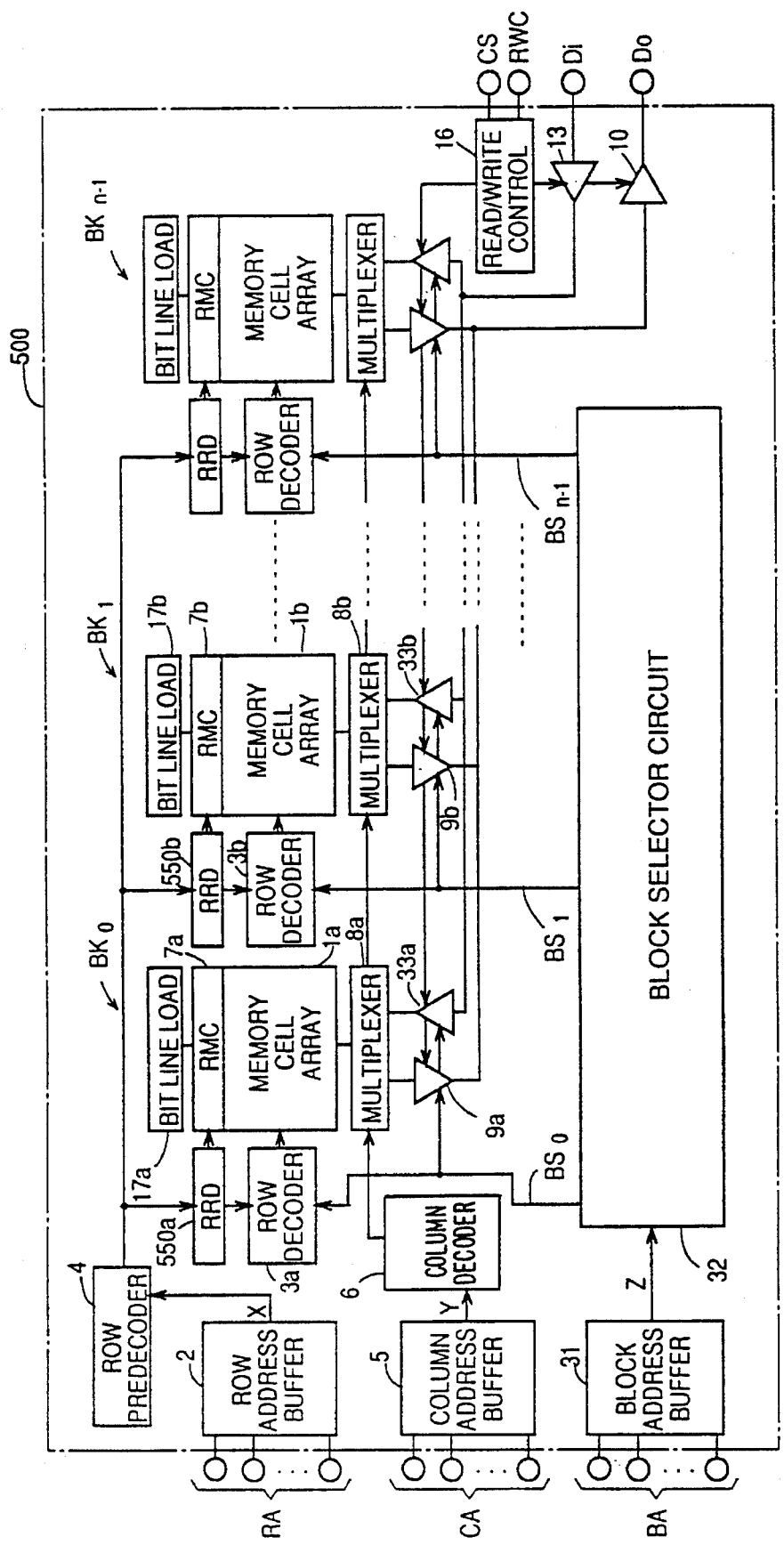
FIG. 7 is a block diagram of a conventional SRAM.
Figure 8:
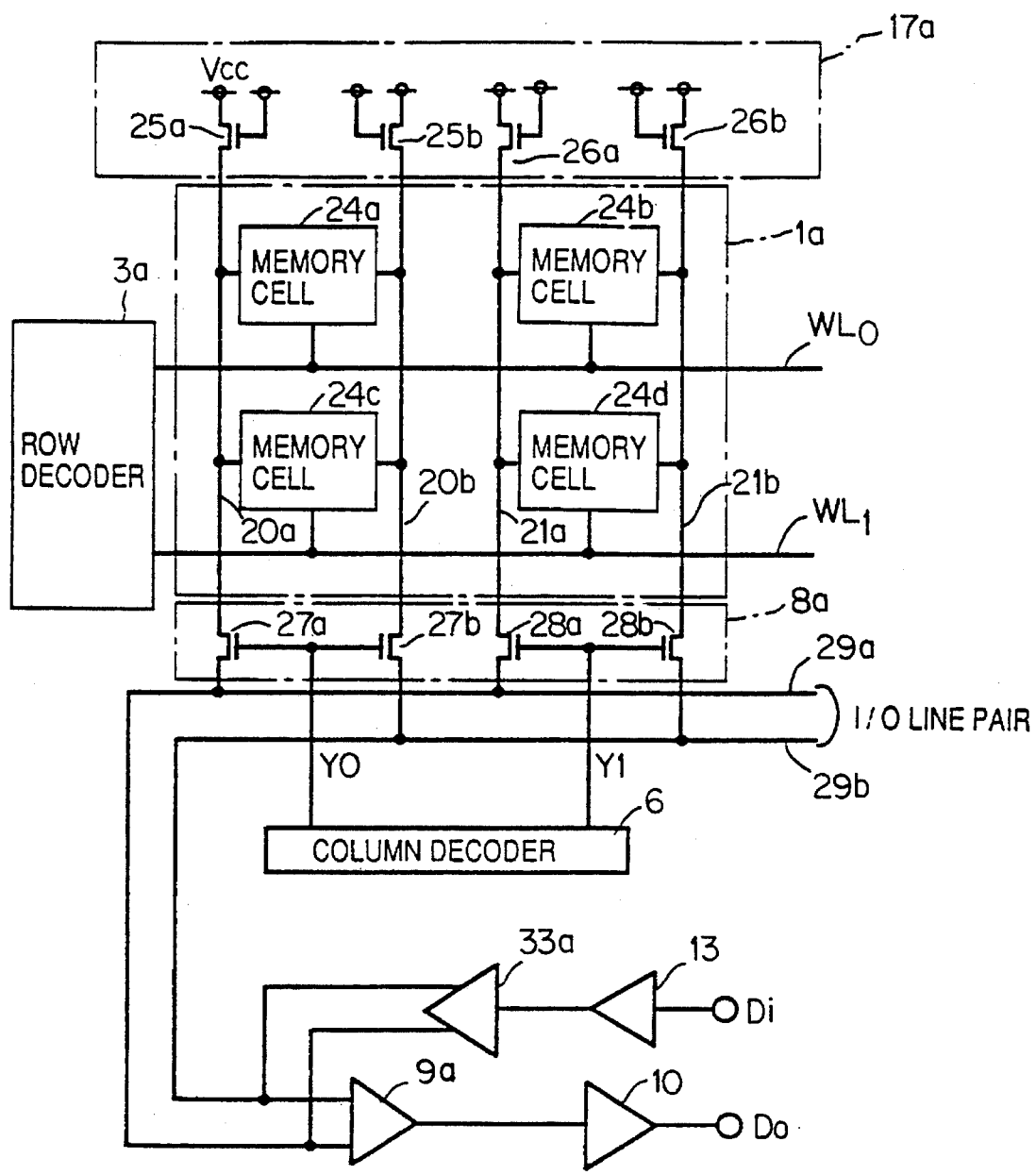
FIG. 8 is a circuit diagram of a main portion including a memory cell array of the SRAM shown in FIG. 7.
Figure 9:
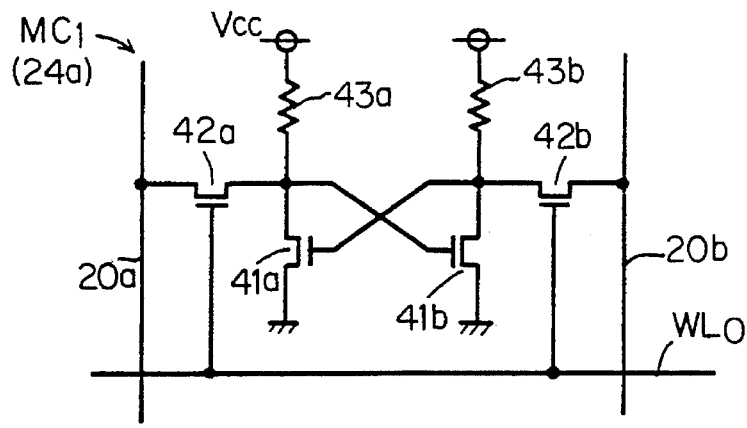
FIG. 9 is a circuit diagram showing one example of a memory cell of the memory cell array shown in FIG. 8.
Figure 10:
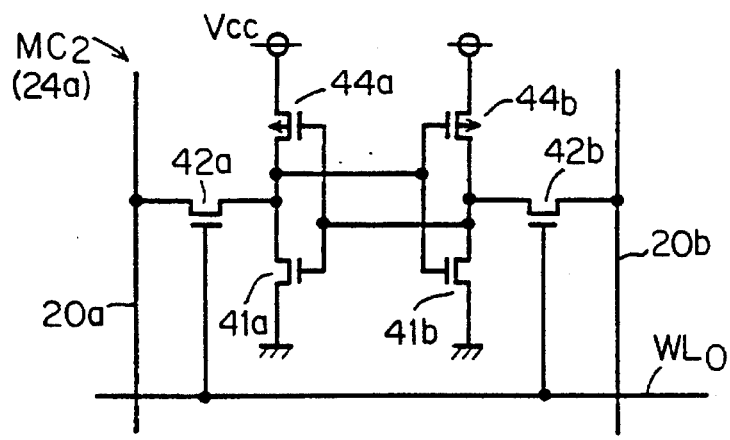
FIG. 10 is a circuit diagram showing another example of the memory cell of the memory cell array shown in FIG. 8.
Figure 11:
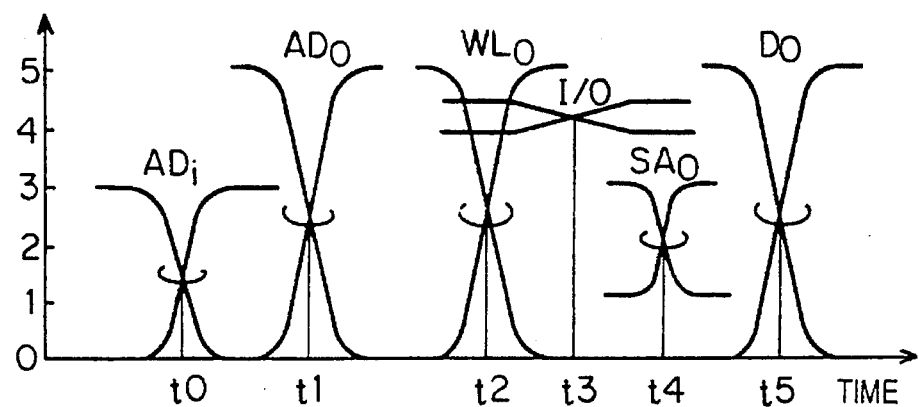
FIG. 11 is a timing chart for explaining reading operation of the memory cell array shown in FIG. 8.
Figure 12:
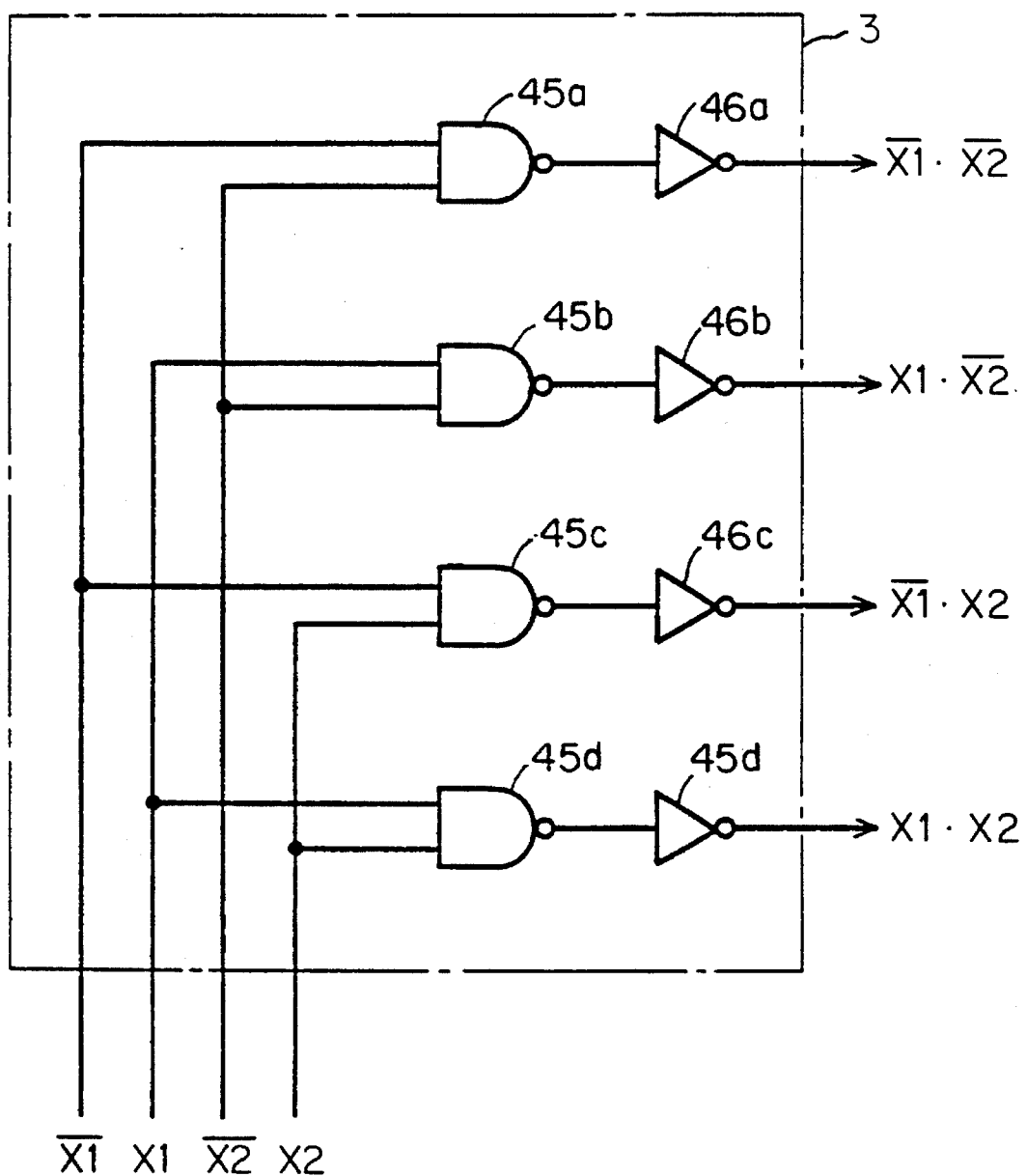
FIG. 12 is a circuit diagram of a predecoder of the SRAM shown in FIG. 7.
Figure 13:
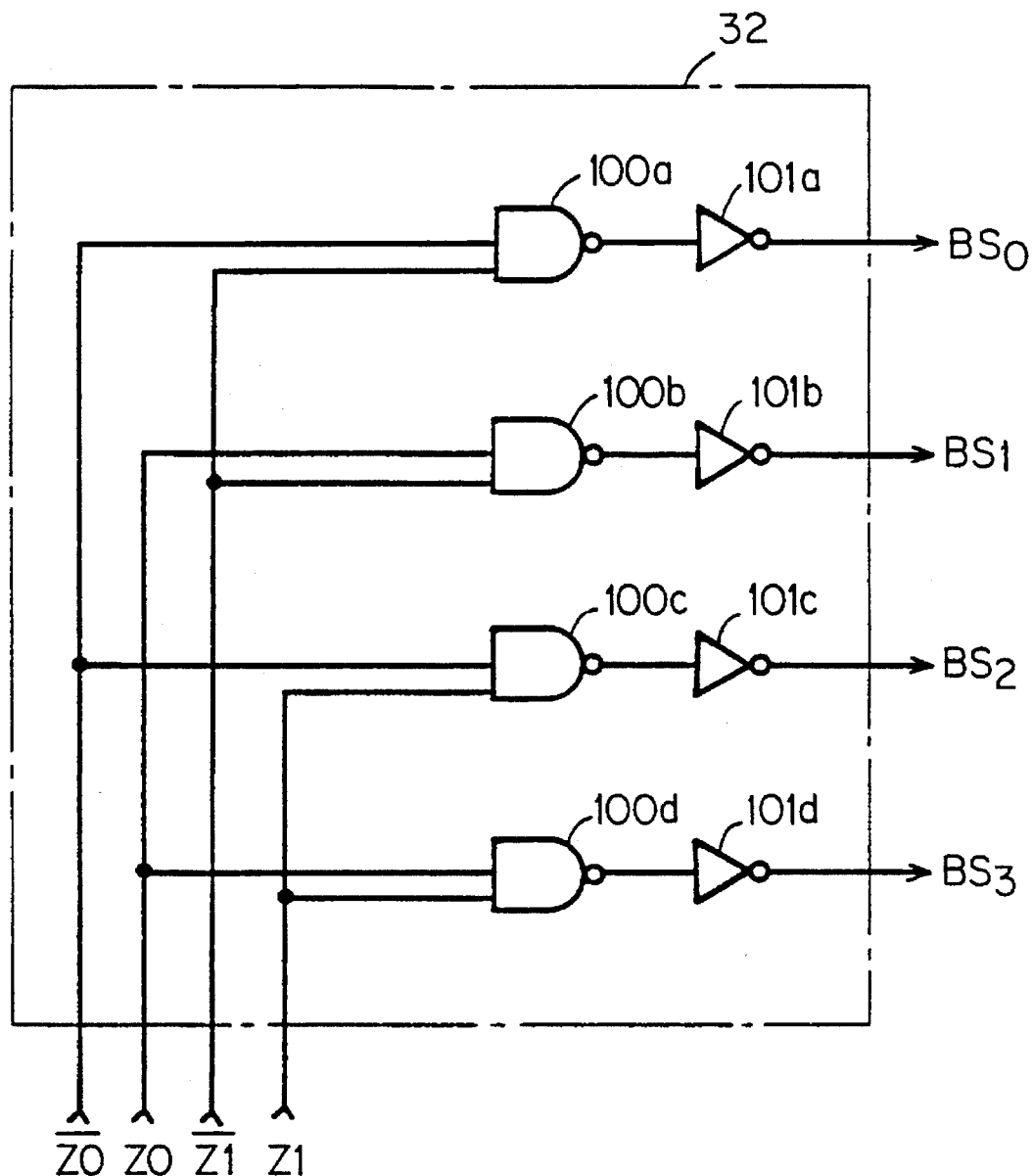
FIG. 13 is a circuit diagram of a block selector circuit of the SRAM shown in FIG. 7.

Referring to FIG. 1, an SRAM 100 includes n memory cell blocks $BK_0$ to $BK_{n-1}$ respectively including improved redundancy row decoders (RRD) 450a, 450b, . . . . Since the circuit configuration is the same as that of SRAM 500 shown in FIG. 7 excluding improved redundancy row decoders 50a, 450b, . . . , the description will not be repeated.

Figure 2:
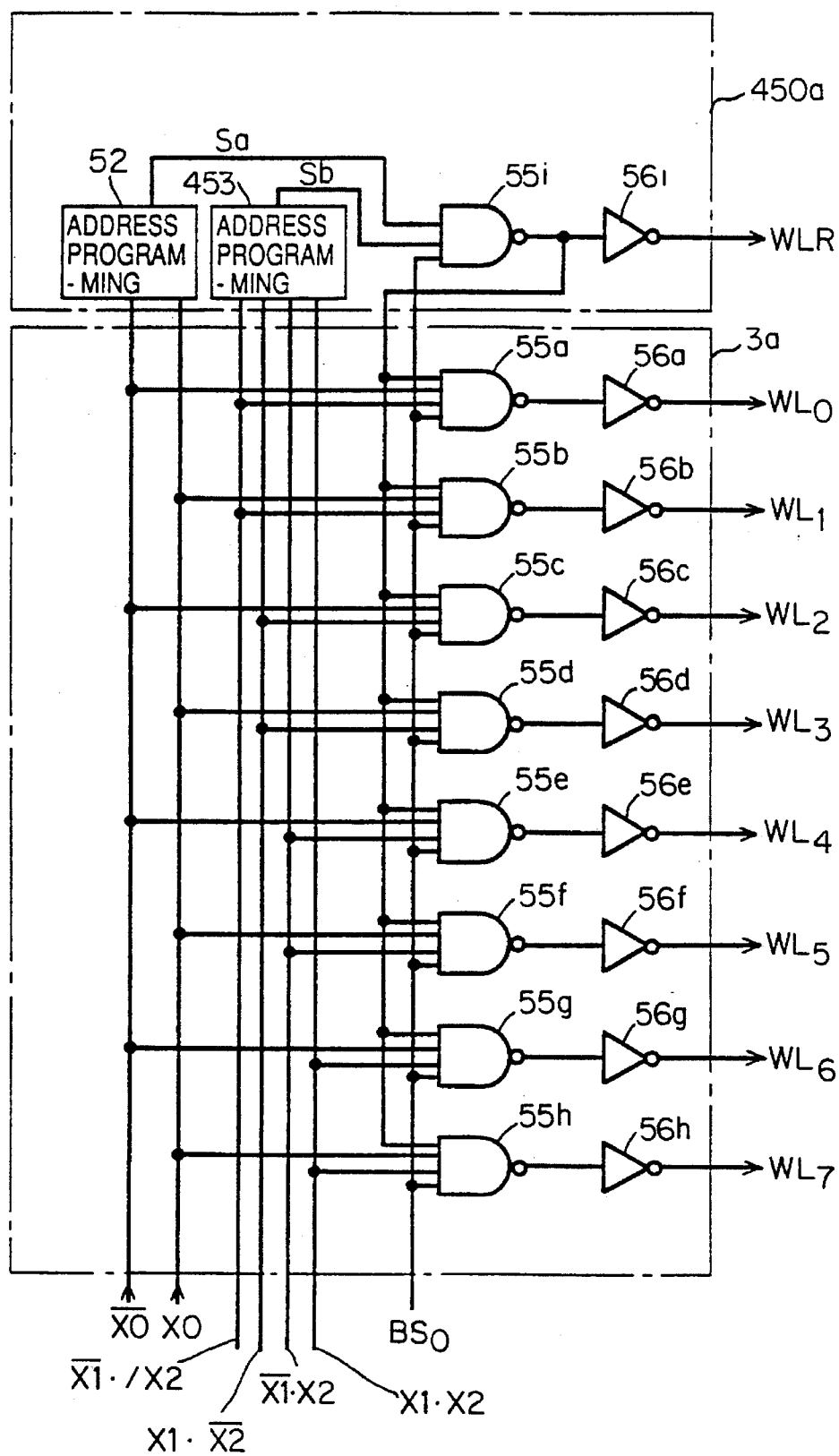
FIG. 2 is a circuit block diagram of a row decoder and a redundancy row decoder of the SRAM shown in FIG. 1.

FIG. 2 is a circuit block diagram showing configurations of row decoder 3a and redundancy row decoder 450a of SRAM 100 shown in FIG. 1. FIG. 2 shows only the circuit portion for accessing eight memory cell rows and one redundancy memory cell row in memory cell array 1a. It is pointed out that row decoder 3b, . . . and redundancy row decoder 450b, . . . provided in the other memory blocks $BK_1$ to $BK_{n-1}$ shown in FIG. 1 have the same circuit configurations as shown in FIG. 2. Since the circuit configuration shown in FIG. 2 is the same as that shown in FIG. 14 excluding redundancy row decoder 450a, the description will not be repeated.

Figure 14:
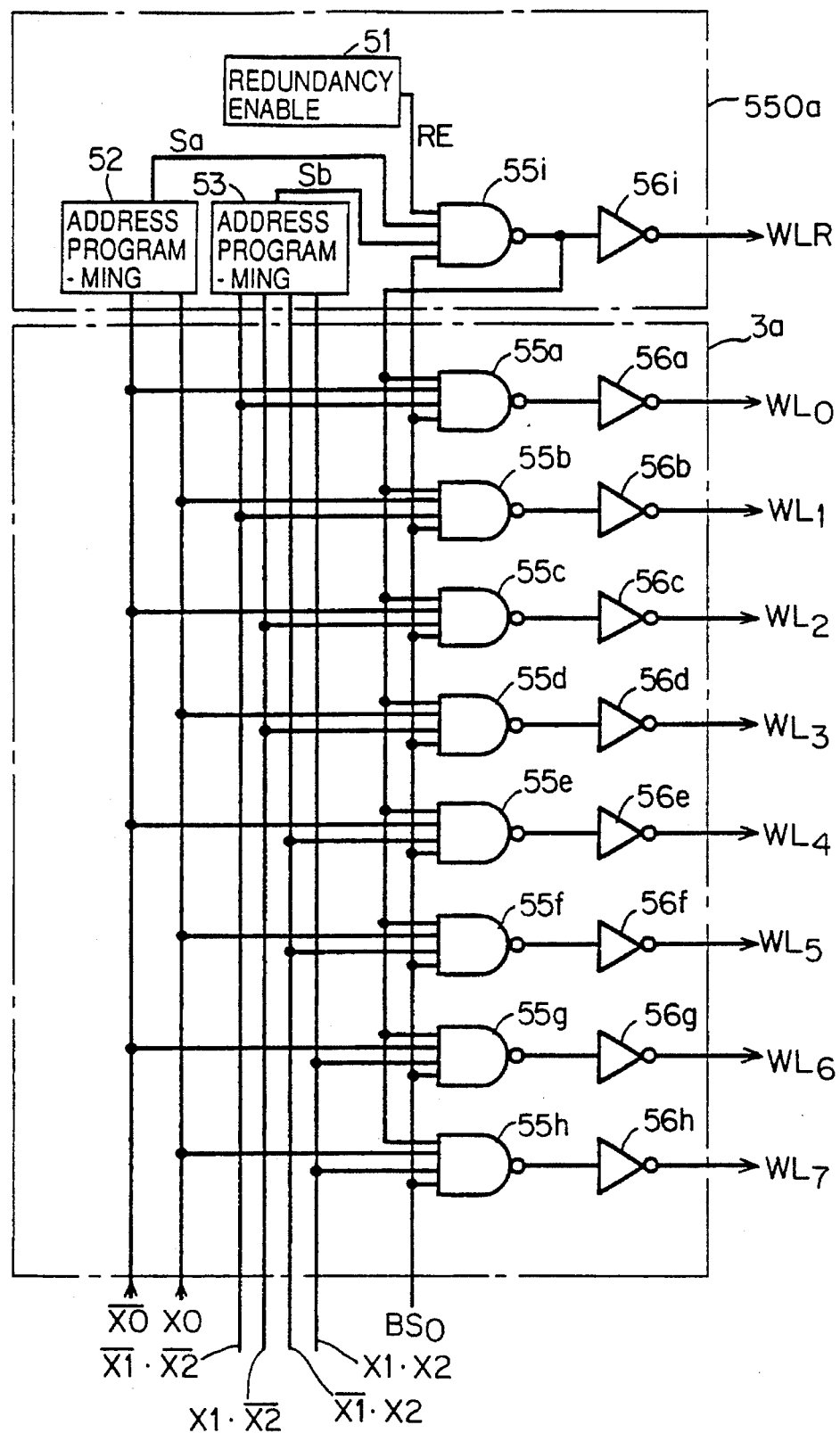
FIG. 14 is a circuit block diagram of a row decoder and a redundancy row decoder of the SRAM shown in FIG. 7.
Figure 15:
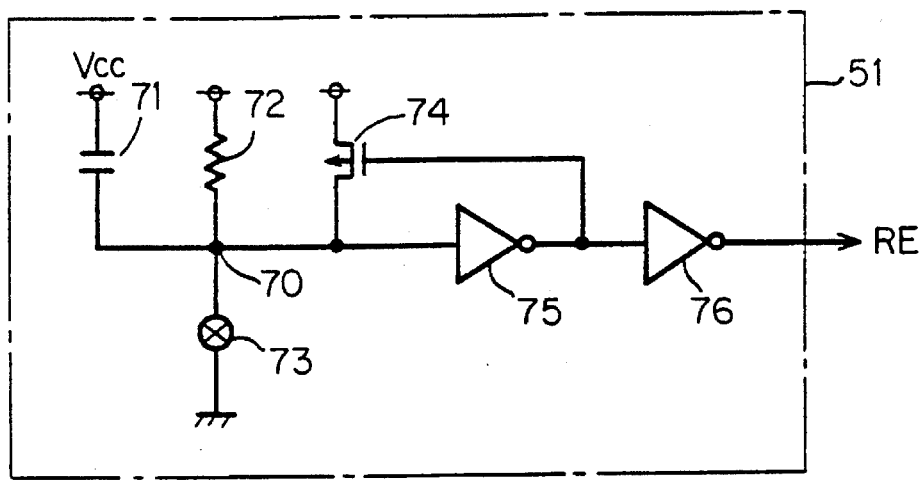
FIG. 15 is a circuit diagram of a redundancy enable circuit of the redundancy row decoder shown in FIG. 14.

Redundancy row decoder 450a includes an address program circuit 453 enabling redundancy row decoder 450 per se and programming a defective address defining a memory cell row in which a defective memory cell exists. NAND gate 55i is connected so as to receive the signal Sb provided from address program circuit 453. Redundancy enable circuit 51 is not shown. Since the other circuit configuration is the same as shown in FIG. 14 excluding redundancy enable circuit 51 and address programming circuit 453, the description will not be repeated.

Figure 3:
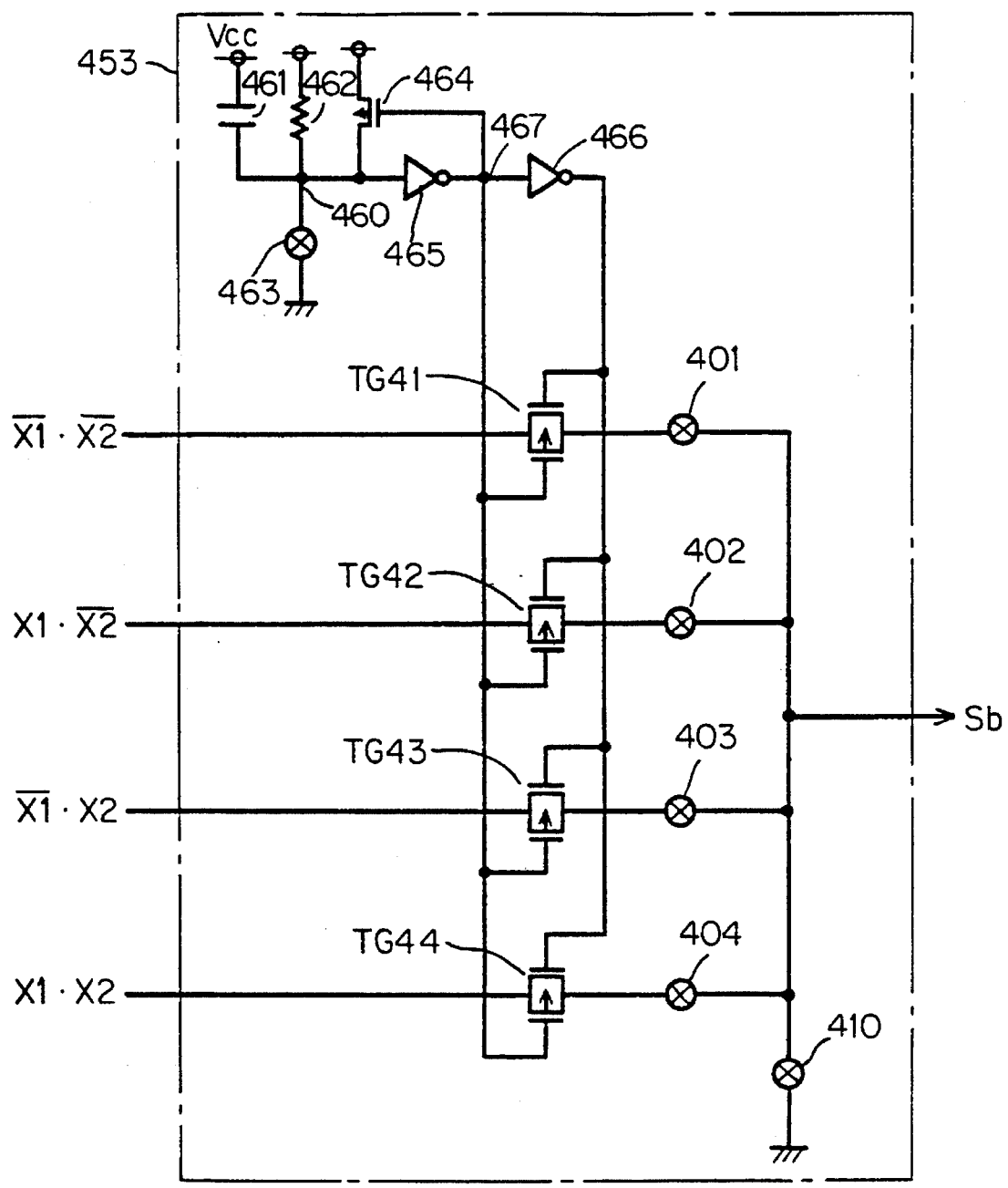
FIG. 3 is a circuit diagram of an address program circuit of the SRAM shown in FIG. 1.

FIG. 3 is a circuit diagram of address program circuit 453. Address program circuit 453 shown in FIG. 2 is implemented with circuit 453 shown in FIG. 3. Referring to FIG. 3, address program circuit 453 includes a capacitor 461, a resistance 462 and a P channel MOS transistor 464 connected in parallel between the power supply potential $V_{CC}$ and a node 460, a fuse 463 for programming connected between node 460 and the ground, cascaded inverters 465 and 466, and four CMOS transmission gates TG41, TG42, TG43 and TG44. Transmission gates TG41, TG42, TG43 and TG44 respectively pass the input signals $\overline{X1}\cdot\overline{X2}$, $X1\cdot\overline{X2}$, $\overline{X1}\cdot X2$, and $X1\cdot X2$ in response to the potential of node 467. Address program circuit 453 further includes fuses 401, 402, 403 and 404 for programming connected between transmission gates TG41, TG42, TG43 and TG44 and the output Sb, and a fuse 410 connected between the output Sb and the ground for fixing a potential when a redundancy memory cell row is not used.

In operation, when fuse 463 is connected, the potential of node 460 is maintained at a low level. Therefore, the potential of node 467 is maintained at a high level. Since transmission gates TG41, TG42, TG43 and TG44 are turned off, the input signals $\overline{X1}\cdot\overline{X2}$, $X1\cdot\overline{X2}$, $\overline{X1}\cdot X2$, $X1\cdot X2$ are not transmitted as the output signal Sb. At this time, the output signal Sb is maintained at a low level by maintaining fuse 410 in connection.

When fuse 463 is disconnected, the potential of node 460 is maintained at a high level. Therefore, since the potential of node 467 is fixed to a low level by inverter 465, transmission gates TG41, TG42, TG43 and TG44 are turned on. Fuse 410 is disconnected. At this time, one of the input signals $\overline{X1}\cdot\overline{X2}$, $X1\cdot\overline{X2}$, $\overline{X1}\cdot X2$, and $X1\cdot X2$ is transmitted as the output signal Sb. This selection is carried out by the connection/disconnection states of fuses 401, 402, 403 and 404. If fuse 401 is connected and fuses 402, 403 and 404 are disconnected, the input signal $\overline{X1}\cdot\overline{X2}$ is transmitted as the output signal Sb. Similarly, the input signals $X1\cdot\overline{X2}$, $\overline{X1}\cdot X2$ and $X1\cdot X2$ are transmitted as the output signal Sb when fuses 402, 403 and 404 are maintained in connection, respectively.

Figure 16:
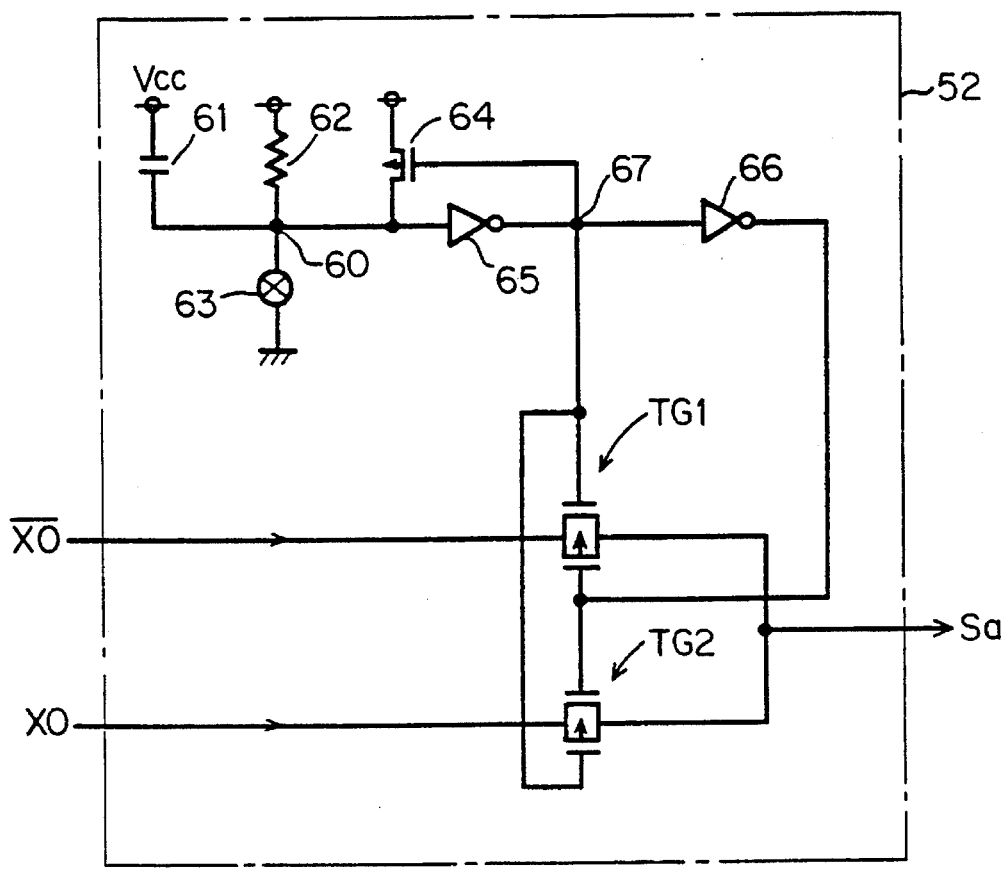
FIG. 16 is a circuit diagram of address program circuit 52 of the redundancy row decoder shown in FIG. 14.
Figure 17:
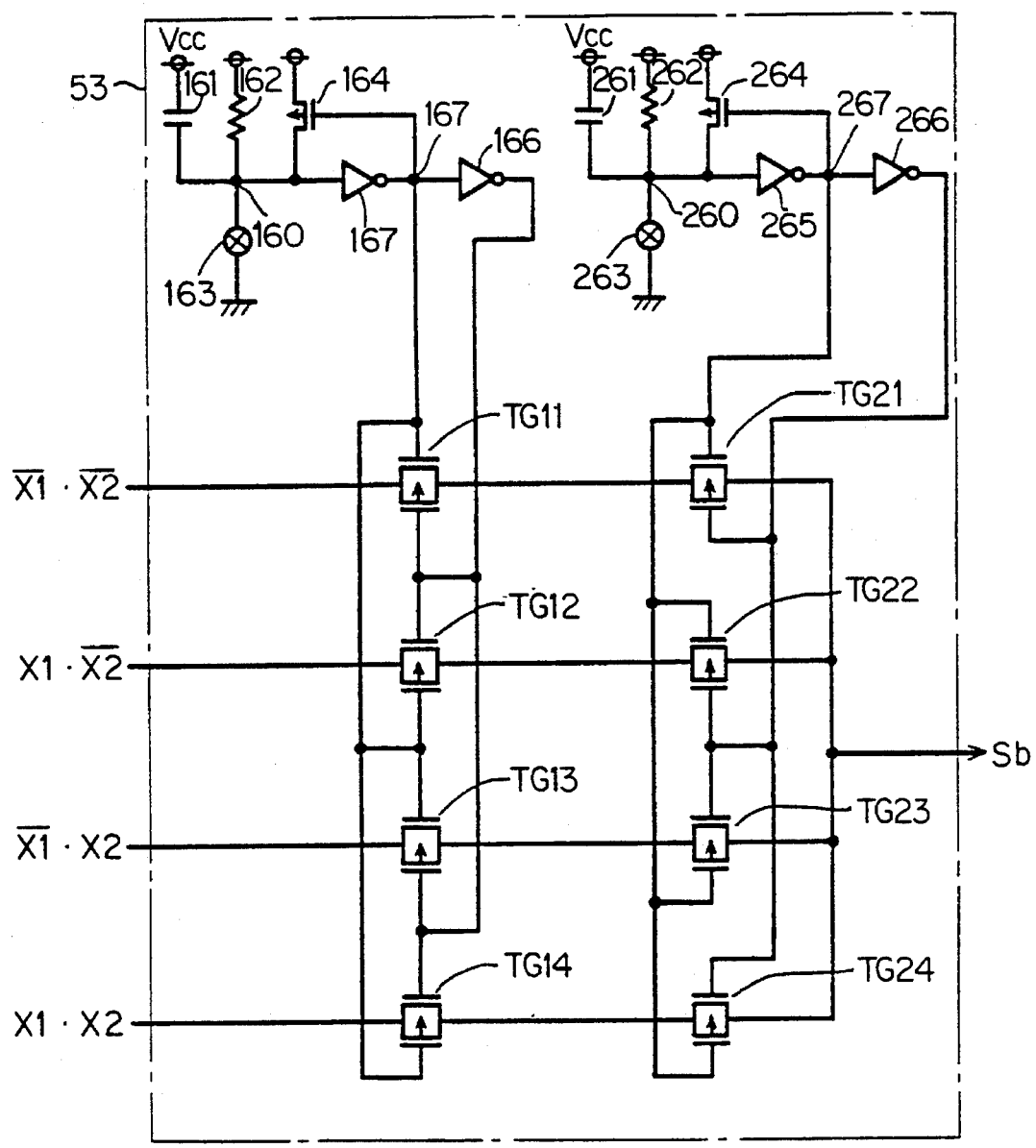
FIG. 17 is a circuit diagram of address program circuit 53 of the redundancy row decoder shown in FIG. 14.
Figure 18:
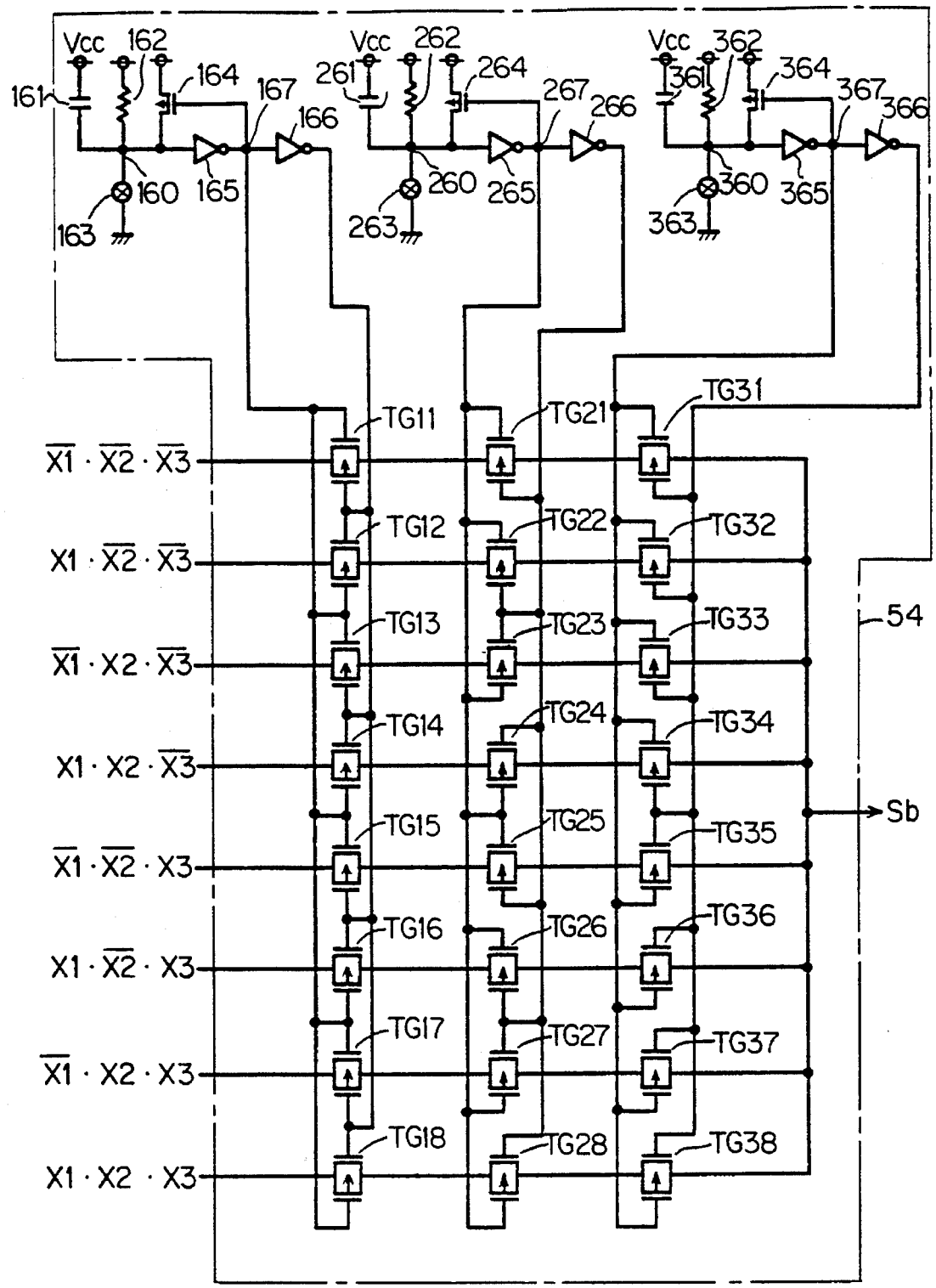
FIG. 18 is a circuit diagram of an address program circuit in the case of eight predecoder outputs.

Operation of redundancy row decoder 450a shown in FIG. 2 to which circuits 453, 52 shown in FIGS. 3 and 16 are applied will now be described. Description will first be given of the case where there is no defective memory cell in memory cell array 1a, that is, where redundancy memory cell row 7a is not accessed. In this case, fuses 401, 402, 403, 404 and 410 of address program circuit 453 are not disconnected. Therefore, the output signal Sb at a low level is provided to NAND gate 55i. Therefore, since the output signal of NAND gate 55i is maintained at a high level, inverter 56i provides the redundancy word line signal WLR at a low level. As a result, redundancy memory cell row 7a is not to be accessed.

NAND gates 55a to 55h in row decoder 3a receive the output signal at a high level of NAND gate 55i and the block select signal $BS_0$ at a high level. Therefore, NAND gates 55a to 55h selectively activate one of the word lines $WL_0$ to $WL_7$ (selectively bring one of the word lines to a high level)

in response to the signals X0, $\overline{X0}$, $\overline{X1}\cdot\overline{X2}$, X1·$\overline{X2}$, $\overline{X1}$·X2, and X1·X2 provided from predecoder 4. Therefore, a memory cell row connected to the activated word line can be accessed.

When there is a defective memory cell in memory cell array 1a, that is, when a defective memory cell is replaced with redundancy memory cell row 7a, a row in which a defective memory cell exists, that is, a row address defining a defective memory cell, is programmed by selectively disconnecting fuses in address program circuits 52 and 453.

Provided that there is a defective memory cell in a memory cell row connected to the word line $WL_0$, programming for defining this memory cell row is carried out. More specifically, by maintaining corresponding fuses 63 and 401 in row address program circuits 52 and 453 in connection, programming for defining the memory cell row is carried out. As a result, address program circuit 52 provides the input signal $\overline{X0}$ as the output signal Sa. On the other hand, address program circuit 453 provides the input signal $\overline{X1}\cdot\overline{X2}$ as the output signal Sb. Therefore, when the input signals $\overline{X0}$ and $\overline{X1}\cdot\overline{X2}$ both at a high level are applied, the output signals Sa and Sb at a high level are applied to NAND gate 55i. As a result, since NAND gate 55i provides a signal at a low level, inverter 56i provides the redundancy word line signal WLR at a high level. Redundancy memory cell row 7a is accessed in response to the redundancy word line signal WLR at a high level. In addition, since the output signal at a low level of NAND gate 55i is also applied to NAND gate 55a, NAND gate 55a is disabled. In other words, the memory cell row connected to the word line $WL_0$ is not to be accessed at this time.

When there is a defective memory cell row in a memory cell row connected to the word line $WL_1$, corresponding fuse 63 in address program circuit 52 is disconnected, and corresponding fuse 402 in address program circuit 453 is maintained in connection. As a result, NAND gate 55i is enabled upon application of the input signals X0 and $\overline{X1}\cdot\overline{X2}$ at a high level, and the redundancy word line signal WLR is activated.

Figure 4:
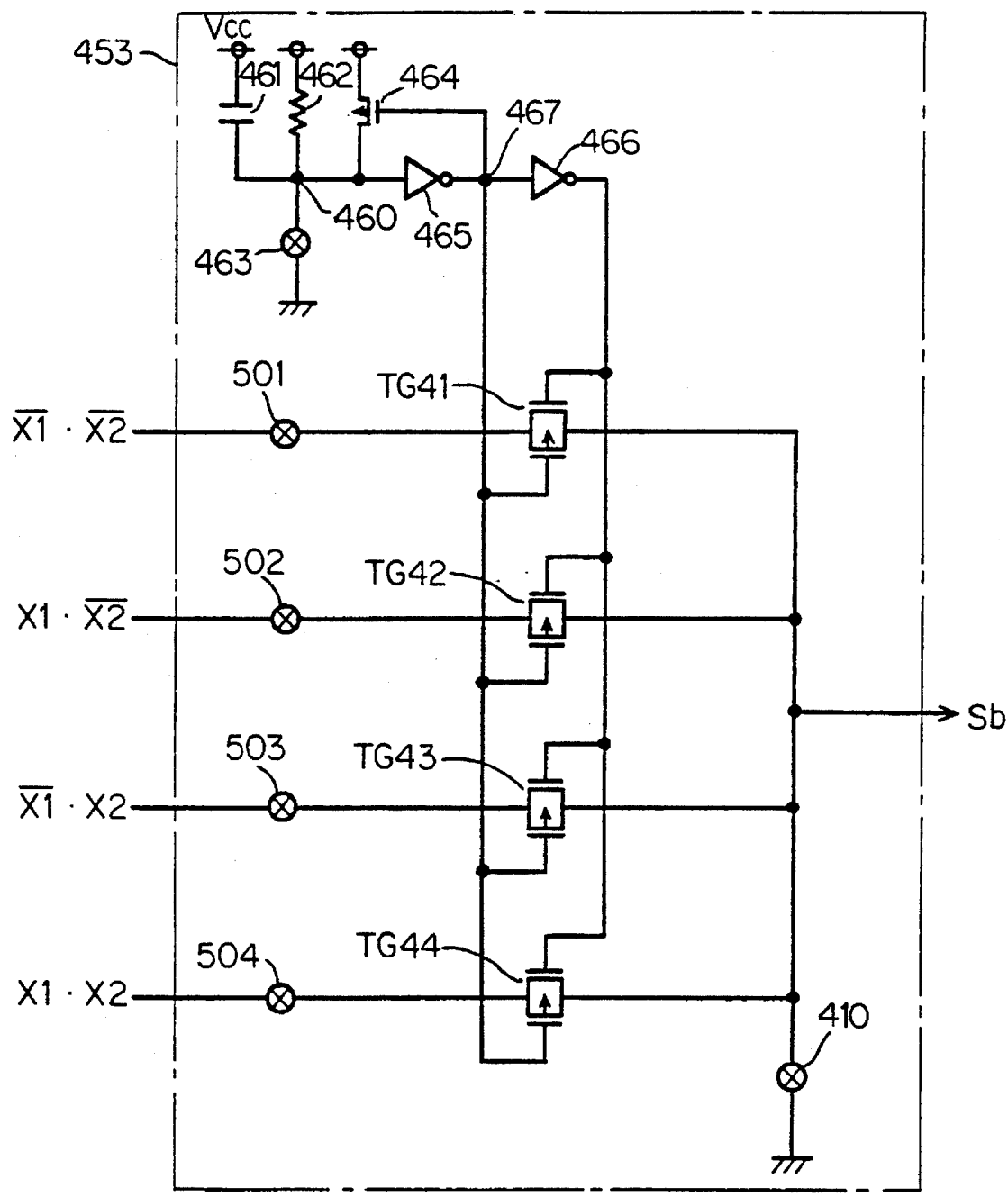
FIG. 4 is a circuit diagram showing another configuration of the address program circuit of the SRAM shown in FIG. 1.

FIG. 4 is a circuit diagram showing another configuration of address program circuit 453. Address program circuit 453 shown in FIG. 2 can be implemented with circuit 453 shown in FIG. 4. Referring to FIG. 4, address program circuit 453 includes fuses 501, 502, 503 and 504 for programming connected between the input signals $\overline{X1}\cdot\overline{X2}$, X1·$\overline{X2}$, $\overline{X1}$·X2, and X1·X2 and transmission gates TG41, TG42, TG43, and TG44, respectively. Since the other circuit configuration is the same as that shown in FIG. 3 excluding provision of fuses 501, 502, 503 and 504 instead of fuses 401, 402, 403 and 404, the description will not be repeated. Since the other circuit operation is the same as that shown in FIG. 3 excluding disconnection of fuses 501, 502, 503 and 504 instead of fuses 401, 402, 403 and 404, the description will not be repeated.

Address program circuit 453 has an advantage that a junction capacitance of transmission gate TG41, TG42, TG43 or TG44 is not added to the input signal $\overline{X1}\cdot\overline{X2}$, X1·$\overline{X2}$, $\overline{X1}$·X2 or X1·X2, when fuse 501, 502, 503 and 504 is disconnected.

Figure 5:
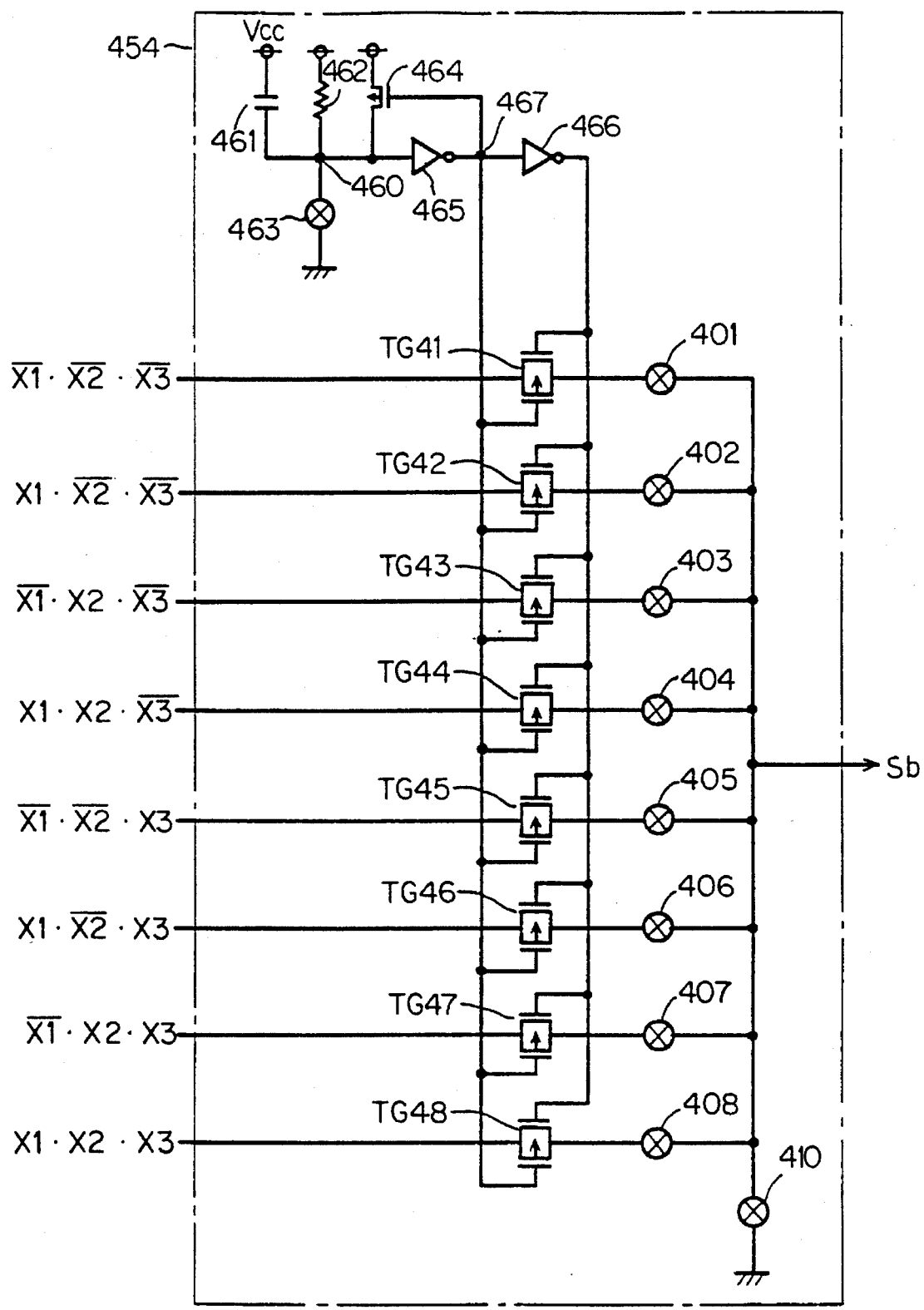
FIG. 5 is a circuit diagram showing still another configuration of the address program circuit of the SRAM shown in FIG. 1.

FIG. 5 is a circuit diagram showing a configuration of address program circuit 454 in the case of eight predecoder outputs. Referring to FIG. 5, address program circuit 454 includes capacitor 461, resistance 462 and P channel MOS transistor 464 connected in parallel between the power supply potential $V_{CC}$ and node 460, fuse 463 for programming connected between node 460 and the ground, cascaded inverters 465 and 466, and eight CMOS transmission gates TG41, TG42, TG43, TG44, TG45, TG46, TG47 and TG48. Transmission gates TG41, TG42, TG43, TG44, TG45, TG46, TG47 and TG48 pass the input signals $\overline{X1}\cdot\overline{X2}\cdot\overline{X3}$, X1·$\overline{X2}\cdot\overline{X3}$, $\overline{X1}$·X2·$\overline{X3}$, X1·X2·$\overline{X3}$, $\overline{X1}\cdot\overline{X2}$·X3, X1·$\overline{X2}$·X3, $\overline{X1}$·X2·X3 and X1·X2·X3, respectively. Address program circuit 453 further includes fuses 401, 402, 403, 404, 405, 406, 407 and 408 for programming connected between transmission gates TG41, TG42, TG43, TG44, TG45, TG46, TG47 and TG48 and the output Sb, and a fuse 410 connected between the output Sb and the ground for fixing the potential when a redundancy memory cell row is not used.

In operation, when fuse 463 is connected, the potential of node 460 is maintained at a low level. Therefore, the potential of node 467 is maintained at a high level. Since transmission gates TG41, TG42, TG43, TG44, TG45, TG46, TG47 and TG48 are turned off, the input signals $\overline{X1}\cdot\overline{X2}\cdot\overline{X3}$, X1·$\overline{X2}\cdot\overline{X3}$, $\overline{X1}$·X2·$\overline{X3}$, X1·X2·$\overline{X3}$, $\overline{X1}\cdot\overline{X2}$·X3, X1·$\overline{X2}$·X3, $\overline{X1}$·X2·X3, X1·X2·X3 are not transmitted as the output signal Sb. At this time, the output signal Sb is maintained at a low level by maintaining fuse 410 in connection.

When fuse 430 is disconnected, the potential of node 460 is maintained at a high level. Therefore, since the potential of node 467 is fixed to a low level by inverter 465, transmission gates TG41, TG42, TG43, TG44, TG45, TG46, TG47 and TG48 are turned on. Fuse 410 is disconnected. At this time, the input signals $\overline{X1}\cdot\overline{X2}\cdot\overline{X3}$, X1·$\overline{X2}\cdot\overline{X3}$, $\overline{X1}$·X2·$\overline{X3}$, X1·X2·$\overline{X3}$, $\overline{X1}\cdot\overline{X2}$·X3, X1·$\overline{X2}$·X3, $\overline{X1}$·X2·X3 and X1·X2·X3 are transmitted as the output signal Sb. This selection is carried out by connection/disconnection states of fuses 401, 402, 403, 404, 405, 406, 407 and 408. If fuse 401 is connected and fuses 402, 403, 404, 405, 406, 407 and 408 are disconnected, the input signal $\overline{X1}\cdot\overline{X2}\cdot\overline{X3}$ is transmitted as the output signal Sb. Similarly, when fuses 402, 403, 404, 405, 406, 407 and 408 are maintained in connection, the input signals X1·$\overline{X2}\cdot\overline{X3}$, $\overline{X1}$·X2·$\overline{X3}$, X1·X2·$\overline{X3}$, $\overline{X1}\cdot\overline{X2}$·X3, X1·$\overline{X2}$·X3, $\overline{X1}$·X2·X3 and X1·X2·X3 are transmitted as the output signal Sb, respectively.

Figure 6:
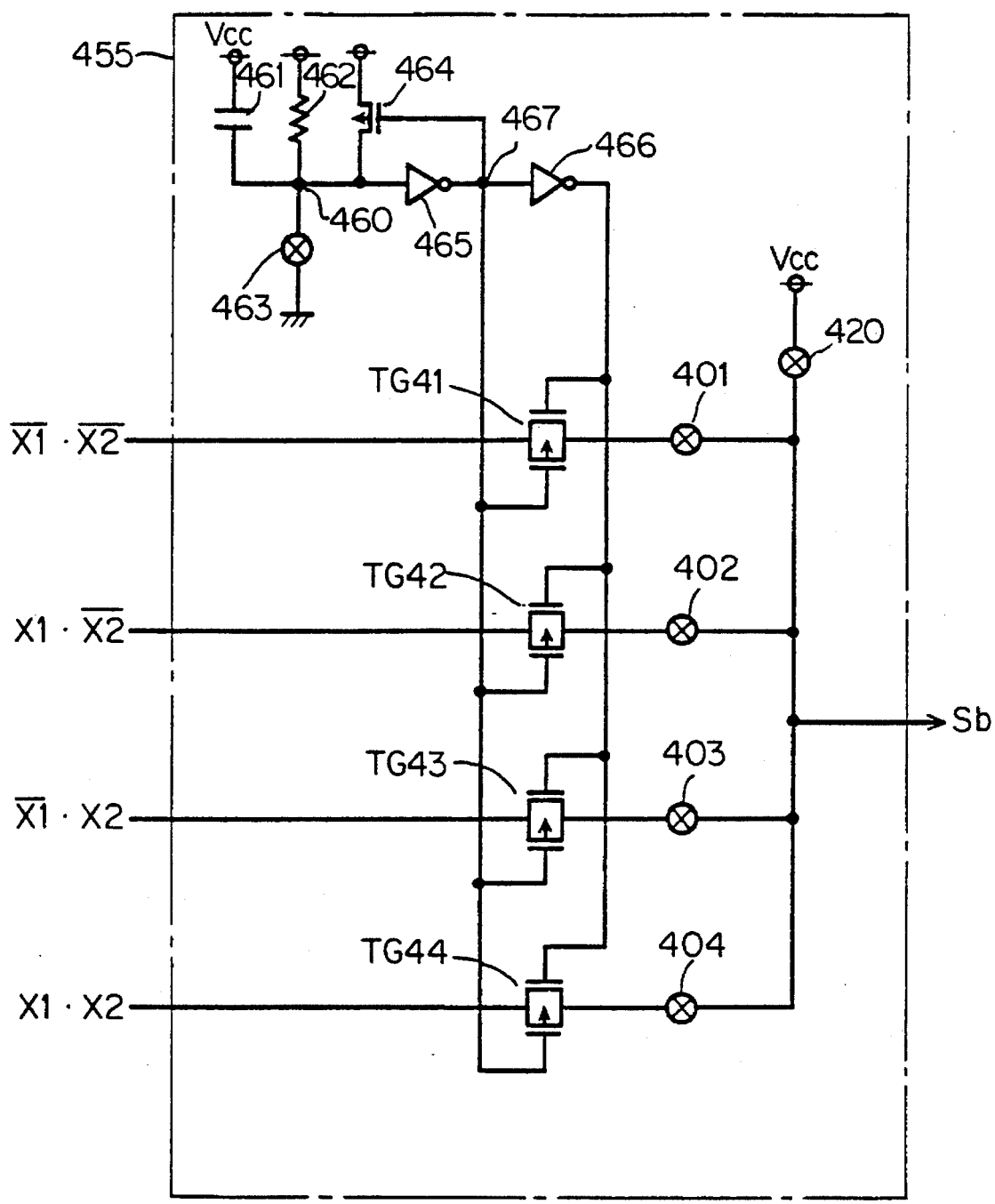
FIG. 6 is a circuit diagram of an address program circuit of an SRAM according to anther embodiment of the present invention.

FIG. 6 is a circuit diagram showing the configuration of address program circuit 455 of an SRAM according to another embodiment of the present invention. This address program circuit 455 is used when the output Sb of address program circuit 455 when a redundancy memory cell row is not used is brought to a high level. Referring to FIG. 6, address program circuit 455 includes a fuse 420 connected between the output Sb and the power supply potential $V_{CC}$ for fixing the potential when a redundancy memory cell row is not used. Since the other circuit configuration is the same as that shown in FIG. 3 excluding provision of fuse 420 instead of fuse 410, the description will not be repeated.

In operation, when fuse 463 is connected, the potential of node 460 is maintained at a low level. The potential of node 467 is maintained at a high level. Therefore, since transmission gates TG41, TG42, TG43 and TG44 are turned off, the input signals $\overline{X1}\cdot\overline{X2}$, X1·$\overline{X2}$, $\overline{X1}$·X2, X1·X2 are not transmitted as the output signal Sb. At this time, the output signal Sb is maintained at a high level by maintaining fuse 420 in connection.

When fuse 463 is disconnected, the potential of node 460 is maintained at a high level. Therefore, since the potential of node 467 is fixed to a low level by inverter 465, transmission gates TG41, TG42, TG43 and TG44 are turned on. Fuse 420 is disconnected. At this time, one of the input signals $\overline{X1}\cdot\overline{X2}$, X1·$\overline{X2}$, $\overline{X1}$·X2 and X1·X2 is transmitted as the output signal Sb. This selection is carried out by connection/disconnection states of fuses 401, 402, 403 and 404. If fuse 401 is connected and fuses 402, 403 and 404 are disconnected, the input signal $\overline{X1} \cdot \overline{X2}$ is transmitted as the output signal Sb. Similarly, when fuses 402, 403 and 404 are maintained in connection, the input signals $X1 \cdot \overline{X2}$, $\overline{X1} \cdot X2$ and $X1 \cdot X2$ are transmitted as the output signal Sb, respectively.

Although an address program circuit for selecting one of four or eight signal lines is shown in the above embodiments, it is pointed out that the present invention can be applied to a circuit for selecting one of the arbitrary number of signal lines.

In the above embodiment, it is considered that it is not necessary to provide transmission gates TG41–TG48. In this case, all the fuses 401 to 408, 410, 420, 463 must be disconnected even if a redundancy memory cell row is not used. It is inferior to the present invention in which any of fuses 401 to 408, 410, 420, 463 does not have to be disconnected when a redundancy memory cell row is not used.

In the above embodiments, an example is shown in which the present invention is applied to an address program circuit for storing a row address defining a defective memory cell. However, it is pointed out that the present invention can be applied to a program circuit for selecting one of a plurality of signal lines. Therefore, the present invention can also be applied to an address program circuit included in a redundancy circuit for replacing a column including a defective memory cell with a redundancy column. In this case, the present invention can be easily applied by replacing rows of the above embodiments with columns.

An example in which the present invention is applied to an SRAM is shown in the above embodiments. However, it is pointed out that the present invention is not limited to an SRAM, and that the present invention can be applied to semiconductor memory devices in general.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a redundancy circuit for replacing a defective memory cell with a redundancy memory cell, wherein said redundancy circuit includes a program circuit for carrying out a programming to replace said defective memory cell with said redundancy memory cell, said program circuit includes a first fuse for selecting between usage and nonusage of said redundancy memory cell, a second fuse for selecting a designation signal designating said defective memory cell, a transmission gate provided in series with said second fuse, and a potential fixing circuit responsive to connection or disconnection of said first fuse for turning on or off said transmission gate.

2. The semiconductor memory device as recited in claim 1, comprising a memory cell array including a plurality of memory cells disposed in the row and column directions, and a row predecoder predecoding a row address signal to provide predecode signals, wherein said program circuit selectively passes only a predecode signal designating a defective memory cell row including said defective memory cell out of said predecode signals, said redundancy circuit includes a redundancy memory cell row to be displaced with said defective memory cell in said memory cell array, and a redundancy row decoder responsive to the predecode signal passing said program circuit for designating said redundancy memory cell row and disabling said row decoder, said first fuse selects between usage and nonusage of said redundancy memory cell row, and said second fuse selects a predecode signal designating said defective memory cell row.

3. The semiconductor memory device as recited in claim 2, wherein said program circuit includes a third fuse for fixing said second fuse and the output side of said transmission gate to a constant potential.

4. The semiconductor memory device as recited in claim 2, wherein said second fuse is provided at the output side of said transmission gate.

5. The semiconductor memory device as recited in claim 2, wherein said second fuse is provided at the input side of said transmission gate.

6. The semiconductor memory device as recited in claim 2, wherein said transmission gate is turned off when said redundancy memory cell row is not used, and turned on when said redundancy memory cell row is used.

7. The semiconductor memory device as recited in claim 1, comprising a memory cell array including a plurality of memory cells disposed in the row and column directions, and a column predecoder predecoding a column address signal for providing predecode signals, said program circuit selectively passes only a predecode signal designating a defective memory cell column including said defective memory cell out of said predecode signals, said redundancy circuit includes a redundancy memory cell column to be replaced with said defective memory cell column in said memory cell array, and a redundancy column decoder responsive to the predecode signal passing said program circuit for designating said redundancy memory cell column and disabling said column decoder, said first fuse selects between usage and nonusage of said redundancy memory cell column, and said second fuse selects a predecode signal designating said defective memory cell column.

8. The semiconductor memory device as recited in claim 7, wherein said program circuit includes a third fuse for fixing said second fuse and the output side of the transmission gate to a constant potential.

9. The semiconductor memory device as recited in claim 7, wherein
said second fuse is provided at the output side of said transmission gate.

10. The semiconductor memory device as recited in claim 7, wherein
said second fuse is provided at the input side of said transmission gate.

11. The semiconductor memory device as recited in claim 7, wherein
said transmission gate is turned off when said redundancy memory cell column is not used, and turned on when said redundancy memory cell column is used.

* * * * *